US00RE44134E

(19) United States
(12) Reissued Patent
Wong et al.

(10) Patent Number: US RE44,134 E
(45) Date of Reissued Patent: Apr. 9, 2013

(54) UNIVERSAL INPUT APPARATUS

(75) Inventors: Thomas S. Wong, San Jose, CA (US); Stephen J. B. Pratt, Saratoga, CA (US)

(73) Assignee: Micrel, Inc., San Jose, CA (US)

(21) Appl. No.: 11/706,833

(22) Filed: Feb. 13, 2007

Related U.S. Patent Documents

Reissue of:
(64) Patent No.: 6,864,707
Issued: Mar. 8, 2005
Appl. No.: 10/261,400
Filed: Sep. 30, 2002

(51) Int. Cl.
*H03K 19/003* (2006.01)

(52) U.S. Cl. ..... 326/30; 326/21; 326/63; 327/333

(58) Field of Classification Search ..... 326/30, 326/21, 62, 63; 327/333
See application file for complete search history.

(56) References Cited

U.S. PATENT DOCUMENTS 6,037,798 A * 3/2000 Hedberg ..... 326/30
6,292,028 B1 * 9/2001 Tomita ..... 326/86
6,316,964 B1 * 11/2001 Watarai ..... 326/115
6,362,644 B1 * 3/2002 Jeffery et al. ..... 326/30
6,603,329 B1 * 8/2003 Wang et al. ..... 326/30

OTHER PUBLICATIONS 3.2.7 Receiver Input Impedance, IEEE Std 1596.3-1996 (IEEE Standard for Low-Voltage Differential Signals (LVDS) for Scalable Coherent Interface (SCI), IEEE Computer Society, Jul. 31, 1996).

* cited by examiner

*Primary Examiner* — James H Cho
(74) *Attorney, Agent, or Firm* — Patent Law Group LLP

(57) ABSTRACT

Input structures and topologies are provided for coupling a differential input into a first stage of a circuit, topology, or device. An input pin is coupled to an impedance divider that translates an input voltage to accommodate low input voltage levels, while not saturating an input differential pair. A termination pair with a center tap pin is further coupled to the input pins. The center tap facilitates coupling different termination configurations to the input signal. The topologies accommodate packaged devices that have at least three external pins, two pins for the coupling of a differential input signal, and a pin for the termination pair center tap.

37 Claims, 4 Drawing Sheets

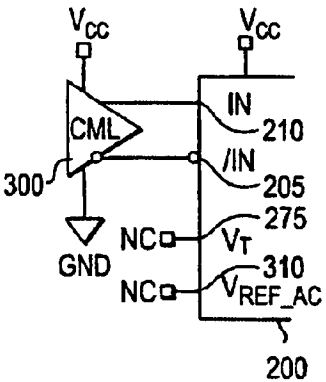
Fig. 9
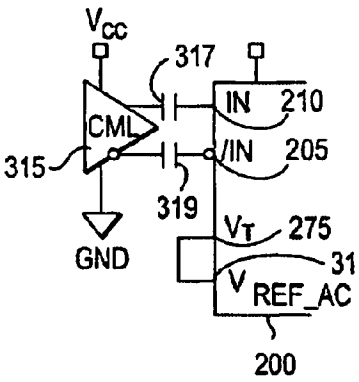
Fig. 10
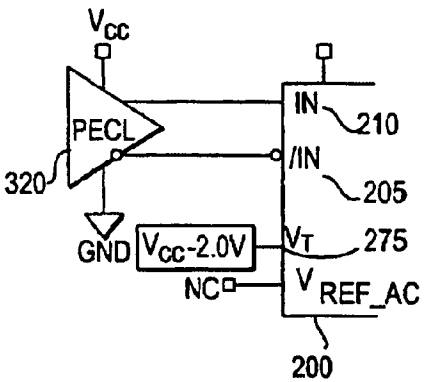
Fig. 11
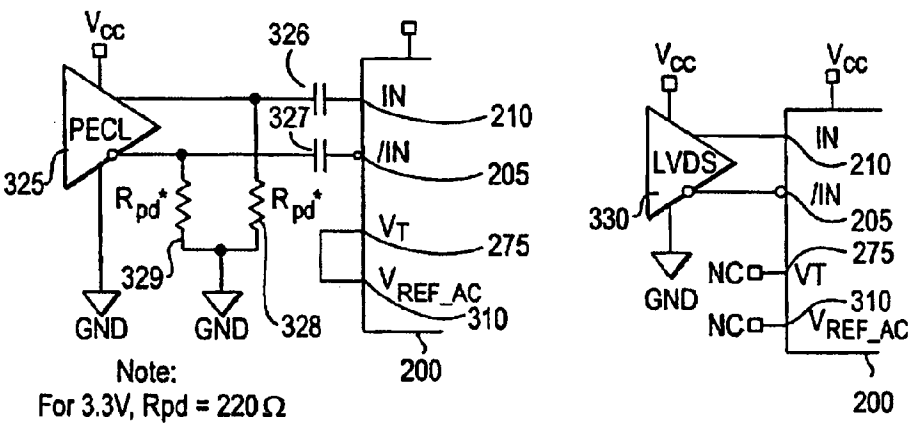
Fig. 12
Fig. 13
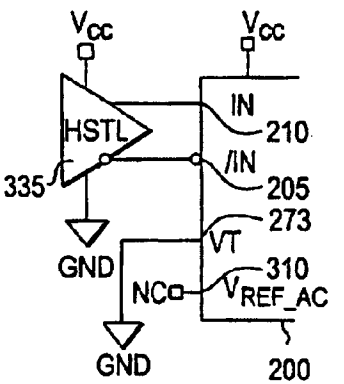
Fig. 14

UNIVERSAL INPUT APPARATUS

Matter enclosed in heavy brackets [ ] appears in the original patent but forms no part of this reissue specification; matter printed in italics indicates the additions made by reissue.

FIELD OF THE INVENTION

The present invention relates generally to input/output logic ("I/O") interface technologies and more particularly to input structures having adaptable input voltage and termination levels.

BACKGROUND

A variety of input/output logic standards are in use today including Positive Emitter-Coupled Logic (PECL), Current-Mode Logic (CML), High Speed Transceiver Logic (HSTL), and Low Voltage Differential Signals (LVDS). These configurations may be AC-coupled or DC-coupled.

Each standard defines its own voltage level, type, and termination required for coupling with another stage, or another device. For example, PECL signals generally have voltage levels ranging from ($V_{CC}$−900 mV) to ($V_{CC}$−1.7V) where $V_{CC}$ represents a supply voltage. CML signals typically have a voltage level ranging from $V_{CC}$ to ($V_{CC}$−400 mV). LVDS signals typically have voltage levels ranging from 1 to 1.4V, and HSTL signals typically have voltage levels ranging from 0.3V to 1.1V. Other signal types may use other voltage ranges.

FIGS. 1-6 depict external termination configurations for different logic standards, according to the prior art. As shown in FIG. 1, driver unit 50 generates a CML signal that is terminated using 50Ω resistors 52 and 54 coupled between supply voltage $V_{CC}$ and node 53 and 55, respectively. Nodes 53 and 55 are coupled to output nodes of driver 50 and to input nodes of receiver unit 56. FIG. 2 depicts another termination embodiment for driver unit 57 generating a CML signal, in which a 100Ω resistor 58 is coupled between nodes 59 and 60, which are coupled to output nodes of driver 57 and input nodes of receiver 61.

FIG. 3 depicts a termination configuration for driver 62, generating a PECL output signal using open emitter outputs. Fifty ohm resistors 63 and 64 are coupled between ($V_{CC}$−2V) supply voltage 65 and nodes 66 and 67, respectively. Nodes 66 and 67 each coupled to an output node of driver unit 62 and an input node of receiver unit 68. FIG. 4 depicts a termination configuration from driver unit 69, generating a PECL output signal using emitter follower outputs. One-hundred ohm resistor 70 is coupled between nodes 71 and 72, which are coupled to output nodes of driver 69 and input nodes of receiver 73.

FIG. 5 depicts a termination configuration for driver 74, generating an LVDS output signal. One-hundred ohm resistor 75 is coupled between nodes 76 and 77, which are coupled to output nodes of driver 75 and input nodes of receiver 78.

FIG. 6 depicts a termination configuration for driver unit 79, generating an HSTL output signal using an open emitter output. Fifty ohm resistors 80 and 81 are coupled between a ground node and nodes 82 and 83, respectively. Nodes 82 and 83 are each coupled to an output node of driver unit 79 and an input node of receiver unit 84.

Accordingly, driver devices need to adapt to a variety of input voltage levels and termination requirements to achieve compatibility. This is typically achieved using multiple input circuits, each able to couple with a particular standard, via a multiplexer. See, for example, FIG. 7 where input circuit 100 and input circuit 105 are coupled to multiplexor 110. Input circuit 100 can receive a PECL input signal, while input circuit 105 can receive an LVDS input signal. Circuit 105 develops a differential input signal between nodes 120 and 125, while circuit 100 develops a differential input signal between nodes 130 and 135. Select signal 115 is applied to multiplexor 110 to determine which differential input signal, the signal at nodes 120 and 125, or that at nodes 130 and 135, is coupled to nodes 140 and 145, which are further coupled to an operative circuit of interest (not shown in FIG. 7 for ease of illustration).

Thus, interfacing from one I/O technology, or standard, to another can therefore be a complex and difficult task. Translators and/or complex termination networks may be necessary for a given device to accept input from a variety of common standards.

Accordingly, there is a need in the art for an input structure that can receive an input according to any of a variety of common standards, including accepting input signals at a variety of voltage levels. Further, such an input structure should be able to provide a variety of termination schemes.

The present invention provides such an input structure.

SUMMARY OF THE INVENTION

One aspect of the present invention provides a method for coupling an input signal to a circuit. An input signal according to a first voltage standard is received, and an input voltage proportional to the voltage of the input signal is established using a voltage divider. A center tap pin is coupled to a reference node, where the reference node is chosen based on the voltage standard of the input signal, thereby terminating the input signal.

In another aspect of the present invention, a packaged integrated circuit is provided including an integrated circuit and a package. The integrated circuit includes a first and second voltage divider, each having an intermediate node, and further includes a termination pair. The termination pair includes a first and second resistor, where the first resistor is coupled to the first voltage divider, and the second resistor is coupled to the second voltage divider. The package includes a first input pin coupled to the first voltage divider, a second input pin coupled to the second voltage divider, and a center tap pin coupled to the first and second resistors.

BRIEF DESCRIPTION OF THE DRAWINGS

The accompanying drawings, which are schematic in some instances and are incorporated in and form a part of this specification and, together with the description, serve to explain the principles of the invention and demonstrate one or more embodiments of the invention.

FIGS. 9-14 depict embodiments of interfaces between receiving units comprising a three-pin internal termination scheme and transmitting units generating signals, according to any of a variety of logic protocols.

DETAILED DESCRIPTION OF THE INVENTION

Input structures and topologies are provided for coupling a differential input to a first stage of a circuit, topology, or device. A pair of input pins is coupled to a divider impedance that translates an input voltage level to accommodate low input voltage levels, while not saturating an input differential pair of devices. A termination resistor pair with a center tap is further coupled to the input pins. The center tap facilitates coupling of different termination configurations to the input pins. In practice, packaged devices have at least three external pins, two pins for the coupling of a differential input signal, and one pin for the termination pair center tap.

Figure 8:
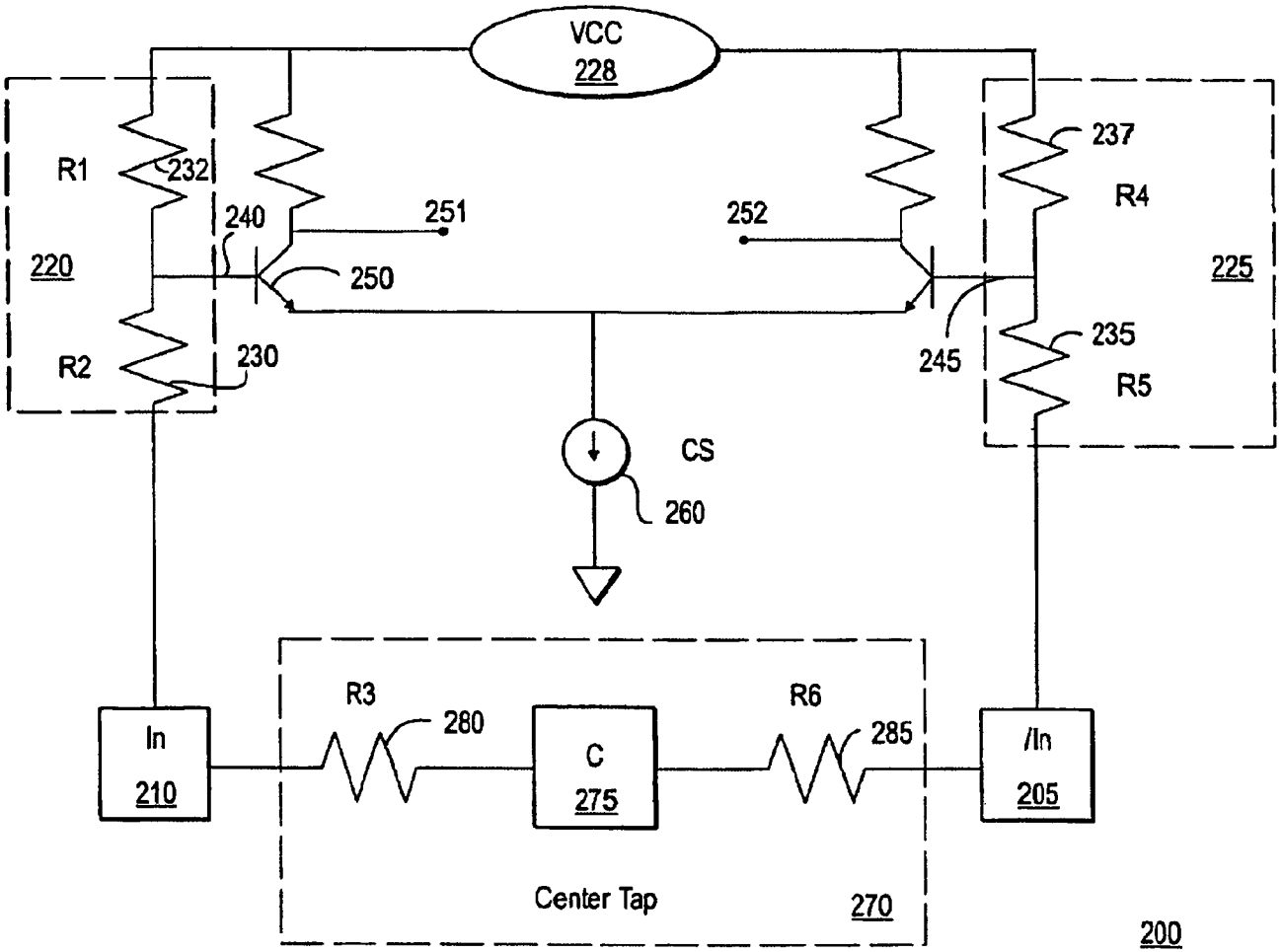
FIG. 8 is a schematic depiction of an input structure, according to an embodiment of the present invention.

One embodiment of an input structure according to the present invention is shown in FIG. 8. Input structure 200 includes two input signal pins, pin 205 and pin 210, for coupling a differential input signal. For purposes of illustration, pin 210 will be referred to as receiving a positive, or non-inverted input signal, while pin 205 receives a negative, or inverted, input signal.

Voltage dividers 220 and 225, e.g. resistors 230, 232, 235, 237, are coupled between an input signal node and a power supply or other reference voltage, such as $V_{CC}$ 228. In a preferred embodiment, resistors 232 and 237 have a value of 1.5 kΩ while resistors 230 and 235 have a value of 1 kΩ. Intermediate nodes 240 and 245 of voltage divider 220 and 225 are coupled to a first input stage, here a differential pair. In FIG. 8, voltage at intermediate nodes 240 and 245 will be higher than the input signal coupled to pins 205 and 210, and lower than reference voltage $V_{CC}$. Resistance values 230, 232, 235, and 237 are chosen such that voltages at node 240 and 245 are large enough to switch input transistors 250 and 255, yet small enough to not substantially affect operation of current source 260. The impedance values noted above are exemplary, and other values could be used. As known in the art, current source 260 can be realized with a wide variety of components and topologies including, but not limited to, the use of bipolar transistors, MOSFETs, and the like. Further, while FIG. 8 depicts an embodiment having input pair bipolar transistors 250 and 255, other devices including MOSFETs may be used. Further, other input divider topologies may be coupled to nodes 240 and 245.

As noted, the embodiment of FIG. 8 depicts voltage dividers 220 and 225 coupled between an input signal and a reference signal to support low voltage input signals, where voltage provided at intermediate node 240 is higher than the voltage at input pin 210. However, in other embodiments, voltage dividers may be coupled between an input signal and a reference signal to support high voltage input signals, that is, where a voltage provided at an intermediate node of the voltage divider is lower than the voltage at an input node.

In FIG. 8, termination resistor pair 270 comprising center tap 275 is further coupled to input pins 210 and 205. Resistors 280 and 285 are selected to provide a particular termination value, preferably about 50 ohms, and center tap 275 allows for an external connection to accommodate different termination requirements. Output to another circuit or device may be taken, for example from nodes 251 and 252.

Figure 1:
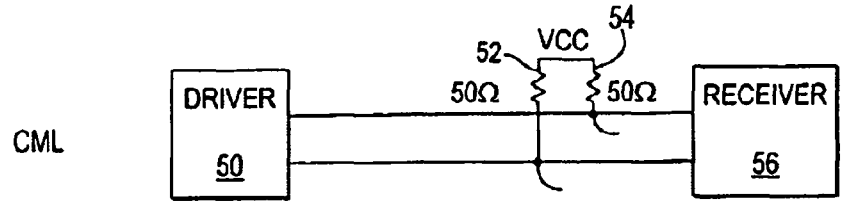
Fig. 1 (Prior Art)
FIGS. 1-6 depict external termination structures for use with various logic standards, according to the prior art.
Figure 2:
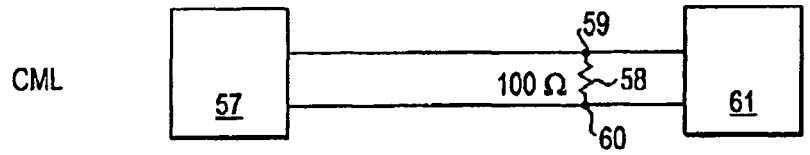
Fig. 2 (Prior Art)
Figure 3:
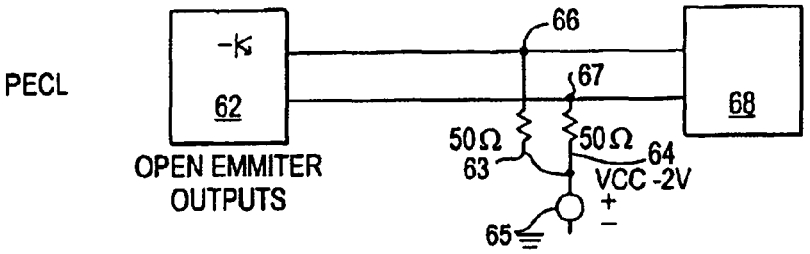
Fig. 3 (Prior Art)
Figure 4:
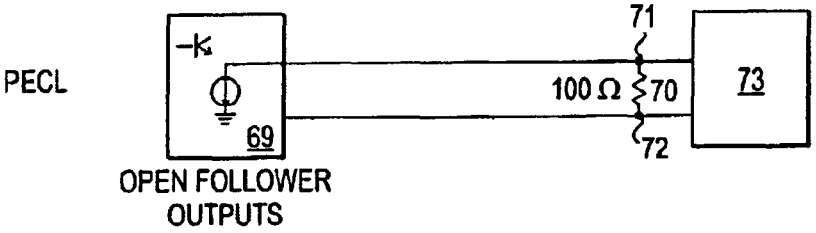
Fig. 4 (Prior Art)
Figure 5:
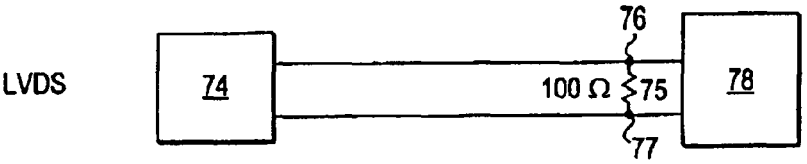
Fig. 5 (Prior Art)
Figure 6:
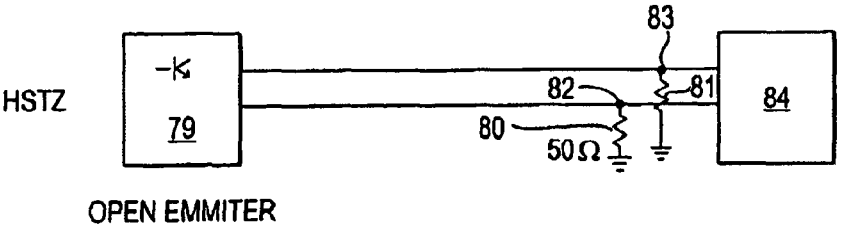
Fig. 6 (Prior Art)
Figure 7:
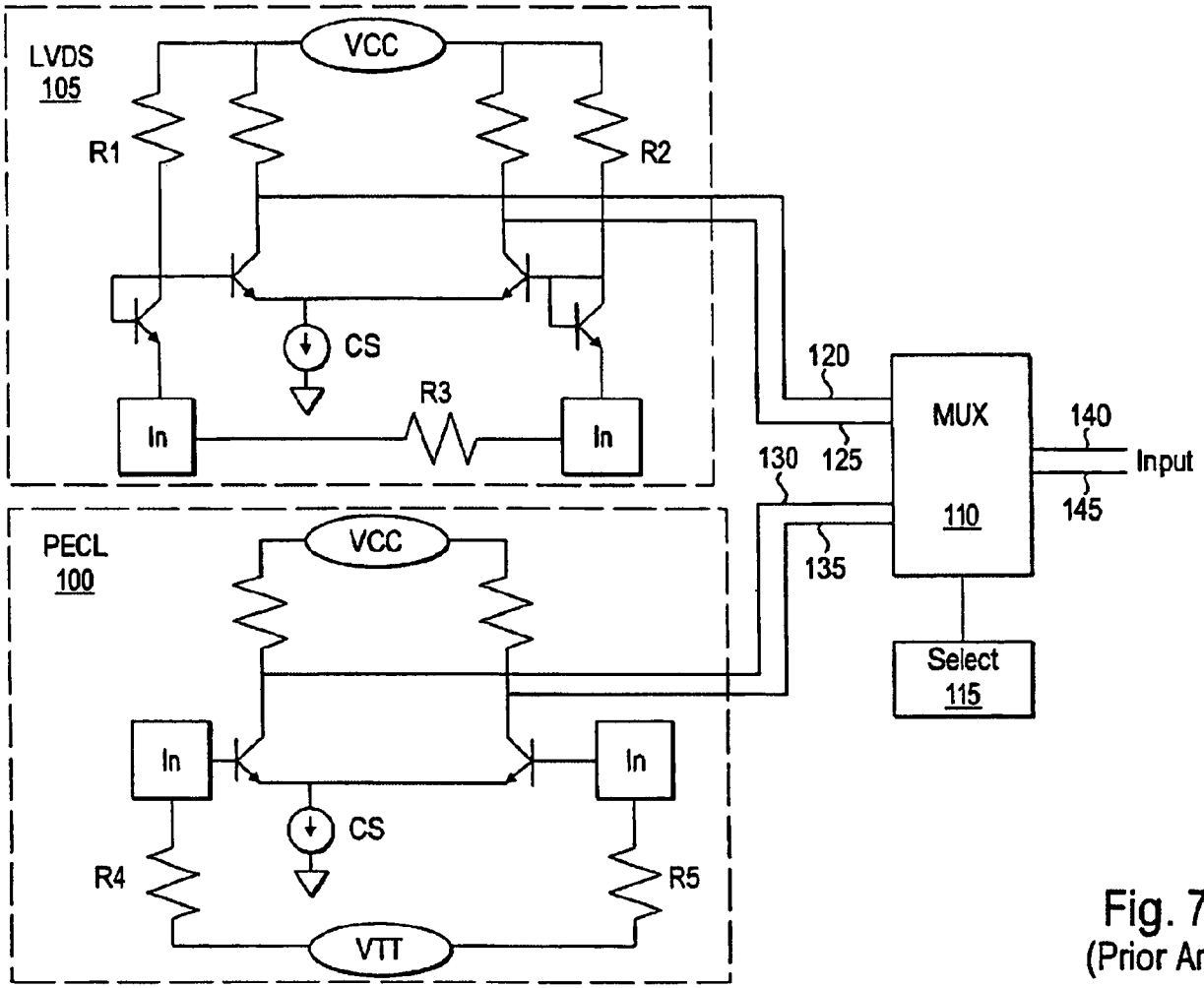
Fig. 7 (Prior Art)
FIG. 7 is a schematic depiction of an input structure, according to the prior art.

Accordingly, input structures provided by the present invention comprise preferably three nodes, coupleable to external signals or devices. In the embodiment of FIG. 8, those three nodes are input pins 210 and 205 and center tap 275. Given that package devices typically provide at least three external pins, this three-pin approach is more convenient than a 4-pin approach commonly used. For example, the external termination configuration shown in FIG. 1 may be implemented using input structure 200 of FIG. 8 by coupling center tap 275 to voltage $V_{CC}$. The external termination configuration shown in FIG. 2 may be implemented using input structure 200 of FIG. 8 by leaving center tap 275 unconnected, or open. The external termination configuration shown in FIG. 3 may be implemented using input structure 200 of FIG. 8 by coupling center tap 275 to voltage ($V_{CC}$−2V). The external termination configuration shown in FIGS. 4 and 5 may be implemented using input structure 200 of FIG. 8, by leaving center tap 275 unconnected, or open. The termination configuration shown in FIG. 6 may be implemented using input structure 200 of FIG. 8 by coupling center tap 275 to a ground node.

Input structures provided by the present invention find use in combination with a variety of circuit topologies and devices. Output taken from a first input stage, such as from the collector nodes of transistors 250 and 255 in the embodiment shown in FIG. 8 may be coupled to substantially any circuit topology that accepts a differential input, e.g., buffer circuits, switches, amplifiers, and the like.

FIGS. 9-14 depict possible interfaces between receiving units comprising the above-described three-pin internal termination configuration and transmitting units generating signals according to any of a variety of logic protocols. Transmitting, or driver units may be AC-or DC-coupled to a receiving unit comprising a universal input structure. Accordingly, some embodiments of the present invention include a $V_{REF_AC}$ pin that allows a simple bias voltage (preferably $V_{CC}$−1.4V) that is also matched to the input stage to be supplied to the center tap pin. In DC-coupled embodiments, the $V_{REF_AC}$ pin is not connected or not present. For example, FIG. 9 depicts an embodiment of input unit 200 having an interface with CML transmitting unit 300, where the units are DC-coupled. CML transmitting unit 300 is coupled between nodes $V_{CC}$ and ground. Output nodes of CML unit 300 are coupled to pins 210 and 205 of input unit 200, and center tap pin 275 is not connected, or open. Unit 200 further comprises a $V_{REF_AC}$ pin, pin 310, which is not connected (open) in the embodiment shown in FIG. 9. In other embodiments, $V_{REF_AC}$ pin 310 is not present. FIG. 10 depicts an embodiment of input unit 200 having an interface with CML transmitting unit 315, where the units are AC-coupled. Capacitors 317 and 319 are each coupled between an output node of unit 315 and an input pin of unit 200. In this embodiment, center tap 275 is coupled to node $V_{REF_AC}$ 310.

FIG. 11 depicts an embodiment of input unit 200 DC-coupled to transmitting unit 320 generating a PECL signal. In this embodiment, input pins 210 and 205 of unit 200 are coupled to output nodes of transmitting unit 320. Center tap 275 is coupled to a voltage ($V_{CC}$−2V) and pin $V_{REF_AC}$ is not connected, and in some embodiments may not be present. FIG. 12 depicts an embodiment of input unit 200 AC-coupled to transmitting unit 325, generating a PECL signal. In FIG. 11, input pins 210 and 205 of unit 200 are coupled through capacitors 326 and 327, respectively, to output nodes of transmitting unit 325. Resistors $R_{pd}$ 328 and 329 are further coupled between ground and input pins 210 and 205, respectively. In a preferred embodiment, $V_{CC}$ is 3.3 volts and $R_{pd}$ is 220Ω. In another preferred embodiment, $V_{CC}$ is 2.5V and $R_{pd}$ is 100Ω. Center tap 275 is coupled to $V_{REF_AC}$ 310.

FIG. 13 depicts an embodiment of input unit 200 DC-coupled to transmitting unit 330, which generates an LVDS signal. Input pins 210 and 205 are coupled to output nodes of LVDS unit 330. Center tap 275 and pin 310 are open, or unconnected. In other embodiments, pin 310 is not provided.

FIG. 14 depicts an embodiment of input unit 200 DC-coupled to transmitting unit 335, which generates an HSTL signal. Input pins 210 and 205 are coupled to output nodes of HSTL unit 335. Center tap 275 is coupled to a ground node, and $V_{REF_AC}$ pin 310 is not connected, and in some embodiments is not present.

The foregoing descriptions of specific embodiments and best mode of the present invention have been presented for purposes of illustration and description. They are not intended to be exhaustive or to limit the invention to the precise forms disclosed, and obviously many modifications and variations are possible in light of the above teaching. For example, the above-described circuit topologies were coupled between a single $V_{CC}$ power supply and ground. As will be readily appreciated by those skilled in the art, embodiments of the present invention include circuit topologies coupled between ground a negative $V_{SS}$ power supply, between two power supplies, $V_{CC}$ and $V_{SS}$, etc. Further, components of the present invention may be fully integrated with one another, or may merely be in functional communication with on another. Some or all components described above may be integrated on one or more semiconductor chips, for example, and other components bonded or otherwise brought into communication with the chip or chips. Further, some or all components described above may be packaged and integrated with methods known in the art, for example on printed circuit boards and the like.

While embodiments described above depicted input signal nodes 205 and 210, as appreciated by those skilled in the art, various devices or topologies may be coupled to or integrated to nodes 205 and 210 for providing a differential input signal including other devices, circuit topologies, single-to-double ended input converters, etc. Further, while voltage dividers 220 and 225 have been described in terms of two resistors each, voltage dividers 220 and 225 may comprise substantially any components, including resistors, transistors, capacitors, and inductors, such that an intermediate node of the voltage divider is coupled to an input stage in such a way that a voltage at the intermediate node is an appropriate voltage for coupling to the input stage.

The embodiments were chosen and described to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for coupling an input signal to a circuit, said method comprising receiving an input signal according to a first voltage standard;

establishing a circuit input voltage proportional to the voltage of said [Input] *input* signal using a voltage divider; and coupling a center tap pin to a reference node, thereby terminating said input signal, wherein said reference node is chosen based on said first voltage standard.

2. A method according to claim 1, wherein said first voltage standard is CML, and said reference node is an open, or not connected, node.

3. A method according to claim 1, wherein said first voltage standard is CML, said input signal is AC-coupled to said circuit, and said reference node is an AC reference node.

4. A method according to claim 1, wherein said first voltage standard is PECL, and said reference node has a voltage (VCC−2V).

5. A method according to claim 1, wherein said first voltage standard is PECL, said input signal is AC-coupled to said circuit, and said reference node is an AC reference node.

6. A method according to claim 1, wherein said first voltage standard is LVDS, and said reference node is an open, or not connected, node.

7. A method according to claim 1, wherein said first voltage standard is HSTL and said reference node is a ground node.

8. A method for coupling a differential output signal according to a first logic standard to a circuit, said method comprising:

providing an integrated circuit comprising:

a first voltage divider having a first intermediate node and a second voltage divider having a second intermediate node; and a termination pair comprising first and second resistors, wherein said first resistor is coupled to said first voltage divider and said second resistor is coupled to said second voltage divider; and a center pin coupled to said first and second resistors;

coupling said differential output signal to said first and second intermediate nodes; and coupling said center pin to a reference node, wherein the voltage at said reference node is chosen based on said logic standard.

9. A method according to claim 8, wherein said first logic standard is CML and said reference node is an open, or not connected, reference node.

10. A method according to claim 8, wherein said first logic standard is CML, said differential output signal is AC-coupled to said first and second voltage dividers, and said reference node comprises an AC reference node.

11. A method according to claim 8, wherein said first logic standard is PECL, and said reference node comprises a node having a voltage (VCC−2V).

12. A method according to claim 8, wherein said first logic standard is PECL, said differential output signal is AC coupled to said first and second voltage dividers, and said reference node comprises an AC reference node.

13. A method according to claim 8, wherein said first logic standard is LVDS and said reference node is an open, or not connected, reference node.

14. A method according to claim 8, wherein said first logic standard is HSTL and said reference node is a ground node.

15. A method according to claim 8, wherein said first and second resistors are 50Ω resistors.

16. A packaged integrated circuit according to claim 8, wherein said first and second resistors are 50Ω resistors.

17. A packaged integrated circuit comprising:

an integrated circuit comprising:

a first voltage divider having a first intermediate node and a second voltage divider having a second intermediate node; and a termination pair comprising first and second resistors, wherein said first resistor is coupled to said first voltage divider and said second resistor is coupled to said second voltage divider; and a package comprising said integrated circuit and a first input pin coupled to said first voltage divider;

a second input pin coupled to said second voltage divider; and a third input pin coupled to said first and second resistors.

*18. A method for coupling an input signal to a circuit, said method comprising*

*receiving the input signal according to a first voltage standard, the input signal being a differential input signal comprising an inverted input signal and a non-inverted input signal, the inverted input signal being applied to a first pin of an integrated circuit package, and the non-inverted signal being applied to a second pin of the integrated circuit package;*

*coupling a third pin of the integrated circuit package, acting as a center tap pin, to a reference node, thereby*

*terminating said input signal, wherein said reference node is chosen based on said first voltage standard, the third pin being connected within the integrated circuit package to the first pin by a first termination resistance, the third pin also being connected within the integrated circuit package to the second pin by a second termination resistance,*

*wherein the third pin is directly connected to a junction between the first termination resistance and the second termination resistance such that there is no additional resistance between the third pin and the junction;*

*amplifying the input signal by a differential amplifier internal to the integrated circuit package;*

*outputting an output signal, controlled by the input signal, on at least a fourth pin of the integrated circuit package; and*

*providing at a fifth pin of the integrated circuit package a reference voltage generated internal to the integrated circuit package, the fifth pin for being connected to the third pin as a reference voltage for AC coupled input signals.*

*19. A method according to claim 18, wherein said first voltage standard is CML, and said reference node is an open, or not connected, node.*

*20. A method according to claim 18, wherein said first voltage standard is CML, said input signal is AC-coupled to said circuit, and said reference node is an AC reference node.*

*21. A method according to claim 18, wherein said first voltage standard is PECL, and said reference node has a voltage (VCC-2V).*

*22. A method according to claim 18, wherein said first voltage standard is PECL, said input signal is AC-coupled to said circuit, and said reference node is an AC reference node.*

*23. A method according to claim 18, wherein said first voltage standard is LVDS, and said reference node is an open, or not connected, node.*

*24. A method according to claim 18, wherein said first voltage standard is HSTL and said reference node is a ground node.*

*25. A method according to claim 18 wherein the reference voltage generated at the fifth pin is nominally a supply voltage (Vcc) minus 1.4 volts.*

*26. A method according to claim 18 wherein the first termination resistance is 50Ω, and the second termination resistance is 50Ω.*

*27. A method according to claim 26 where the first termination resistance and the second termination resistance are resistors.*

*28. A structure comprising an integrated circuit encased in an integrated circuit package, the structure comprising:*

*a first pin and a second pin for receiving a differential input signal according to a first voltage standard;*

*a third pin, acting as a center tap pin, coupled to the first pin by a first termination resistance and coupled to the second pin by a second termination resistance, the first termination resistance and the second termination resistance being internal to the integrated circuit package, the third pin for being coupled to a reference node, wherein said reference node is chosen based on said first voltage standard,*

*wherein the third pin is directly connected to a junction between the first termination resistance and the second termination resistance such that there is no additional resistance between the third pin and the junction;*

*a differential amplifier internal to the integrated circuit package for receiving the input signal;*

*at least a fourth pin for outputting an output signal controlled by the input signal; and*

*a fifth pin of the integrated circuit package, the fifth pin receiving a reference voltage generated internal to the integrated circuit package, the fifth pin for being connected to the third pin as a reference voltage for AC coupled input signals.*

*29. A structure according to claim 28, wherein said first voltage standard is CML, and said reference node is an open, or not connected, node.*

*30. A structure according to claim 28, wherein said first voltage standard is CML, said input signal is AC-coupled to said circuit, and said reference node is an AC reference node.*

*31. A structure according to claim 28, wherein said first voltage standard is PECL, and said reference node has a voltage (VCC-2V).*

*32. A structure according to claim 28, wherein said first voltage standard is PECL, said input signal is AC-coupled to said circuit, and said reference node is an AC reference node.*

*33. A structure according to claim 28, wherein said first voltage standard is LVDS, and said reference node is an open, or not connected, node.*

*34. A structure according to claim 28, wherein said first voltage standard is HSTL and said reference node is a ground node.*

*35. A structure according to claim 28 wherein the reference voltage generated at the fifth pin is nominally a supply voltage (Vcc) minus 1.4 volts.*

*36. A structure according to claim 28 wherein the first termination resistance is 50Ω, and the second termination resistance is 50Ω.*

*37. A structure according to claim 36 where the first termination resistance and the second termination resistance are resistors.*

* * * * *